United States Patent [19]

Ashida

[11] 4,302,731
[45] Nov. 24, 1981

[54] TEMPERATURE-COMPENSATED CRYSTAL OSCILLATOR

[75] Inventor: Shigeaki Ashida, Tokyo, Japan

[73] Assignee: Nippon Electric Co., Ltd., Tokyo, Japan

[21] Appl. No.: 97,649

[22] Filed: Nov. 27, 1979

[30] Foreign Application Priority Data

Nov. 30, 1978 [JP] Japan ............................. 53-148324

[51] Int. Cl.³ .......................... H03B 5/04; B03B 5/36
[52] U.S. Cl. .................................. 331/116 R; 331/176
[58] Field of Search ............... 331/176, 116 R, 177 V, 331/66, 158

[56] References Cited

U.S. PATENT DOCUMENTS

3,454,903 7/1969 Page .............................. 331/176 X

FOREIGN PATENT DOCUMENTS

47-34091 8/1972 Japan .

OTHER PUBLICATIONS

Schodowski, "A New Approach to a High Stability Temperature Compensated Crystal Oscillatorn", Proceedings–24th Annual Symposium on Frequency Control, 1970, pp. 200-208.
Buroker et al., "A Digitally Compensated TCXO", Proceeding of the 27th Annual Symposium on Frequency Control", pp. 191-198.
Fujii et al., "Improvement of Frequency Stability for TCXO", NEC Research and Development, No. 43, Oct. 1976, pp. 75-80.
Ishihara, "Temperature–Compensated Crystal Oscillator", Nippon Dempa Kogyo K.K. Technical Report, 1974, pp. 100-109.
Nippon Electric Company, Data Sheets for Analog IC $\mu$PC616A, 616C, 3911C, pp. 405-408.
Nippon Electric Company, Data Sheets for Varactors, 1S2208, 2209, Silicon Epitaxial Diode, pp. 1004-1005.

*Primary Examiner*—Siegfried H. Grimm
*Attorney, Agent, or Firm*—Laff, Whitesel, Conte & Saret

[57] ABSTRACT

A control voltage for a crystal oscillation circuit is formed by adding two separately generated voltages. One of these voltages is proportionally variable with changes of temperature. The other voltage generally follows the temperature-frequency slope characteristic of the crystal unit. A use of such a control voltage eliminates the requirement for designing specific voltage generator circuits for each respective type of crystal oscillator, thereby enabling a substantial reduction in the cost of manufacture.

9 Claims, 5 Drawing Figures

TEMPERATURE-COMPENSATED CRYSTAL OSCILLATOR

BACKGROUND OF THE INVENTION

This invention relates to temperature-compensated crystal oscillators (TCXO) and more particularly to temperature-compensation voltage generator circuits for use in such oscillators.

Conventionally, a temperature-compensated crystal oscillator of the type concerned in this invention is composed of a voltage-controlled crystal oscillation circuit including a variable-capacitance diode or varactor and a quartz crystal unit. A temperature-compensation-voltage generator circuit includes at least one thermistor and a plurality of resistors. The oscillation frequency of such voltage-controlled crystal oscillation circuit generally has a certain temperature characteristic which is also variable with the capacitance of the variable-capacitance diode. Such an oscillation frequency can, therefore, be held constant by adjusting the varactor capacitance in relation to the frequency-temperature characteristic of the oscillation circuit. In other words, it suffices for the compensation purpose to supply an appropriate control voltage from the temperature-compensation-voltage generator circuit to the variable-capacitance diode.

In general, however, the range of the frequency variation of voltage-controlled crystal oscillators is not very wide. Therefore, it is desirable to begin by selecting a quartz crystal unit having an oscillation-frequency vs. temperature characteristics which lies within a certain definite range. Then, the temperature characteristic of the compensating control voltage is selected so that the oscillation frequency is held constant by varying the ambient temperature of the oscillator. Next, a voltage generator circuit is designed to produce a compensation voltage having approximately the selected temperature characteristic.

For any of other oscillators, such a voltage generator circuit must be designed separately by the same procedure that is described above. In other words, such a voltage generator circuit must be designed for an exclusive use with each of the oscillators. A result is that mass production cannot be applied thereto. Inevitably there is an extraordinarily high labor cost for their manufacture and adjustment. The design procedure described above is, therefore, economically undesirable particularly with crystal oscillators required to have a frequency stability (Δf/f) in the order of ±5 ppm within a range of 31 30° C. to +70° C. For a description of such oscillators, reference may be had to the paper, (1) "A New Approach to a High Stability Temperature Compensated Crystal Oscillator" by S. Schodowski, Proceedings of the 24th Annual Symposium on Frequency Control, pp. 200-208, 1970.

Another known form of crystal oscillator, is disclosed in the paper, (2) "A Digitally Compensated TCXO" by G. E. Buroker et al., Proceedings of the 27th Annual Symposium on Frequency Control, pp. 191-198, 1972. This oscillator includes a temperature-compensation-voltage generator circuit consisting of a temperature-to-frequency converter, a counter, a digital memory, a D/A converter and an analog memory. This circuit, however, is very complicated, of high cost, and is not practical for general-purpose crystal oscillators.

Further references are cited below for a better understanding of the present invention (3) Shuzo Fujii et al, "Improvement of Frequency Stability for TCXO," NEC Research and Development, No. 43, pp. 75-80, October, 1976.

(4) Ishihara, "Temperature-Compensated Crystal Oscillator," Nippon Dempa Kogyo K.K. Technical Report, pp. 100-109, 1974.

(5) Japanese patent publication No. 47-34091 (published Aug. 29, 1972).

SUMMARY OF THE INVENTION

The present invention has for its object the provision of a high-stability, temperature-compensated crystal oscillator which is free from the disadvantages previously encountered as described hereinbefore. Another object is to provide such a crystal oscillator which is suitable for mass production and which is inexpensive.

According to the present invention, a temperature-compensated crystal oscillator is of the type including a voltage-controlled crystal oscillation circuit. A quartz crystal unit and a variable-capacitance diode respond to a control voltage, for varying the oscillation frequency. A control-voltage generator circuit is arranged to produce the control voltage in order to maintain within definite limits the variation, with temperature, of the oscillation frequency. The crystal oscillator is characterized in that the control-voltage generator circuit produces a first voltage $V_1(T)$ which is variable with and in proportion to temperature changes. A second voltage $V_2(T)$ varies with temperature and in a curvilinear relation thereto, and is controlled by at least one thermistor and a plurality of resistors. The first and second voltages produce the control voltage and are described as: $V_S(T_O)+G_1\Delta V_1(T)+G_2\Delta V_2(T)$, where $V_S(T_O)$ represents the reference voltage at a reference temperature $T_O$, $\Delta V_1(T)=V_1(T)-V_S(T_O)$ and $\Delta V_2(T)=V_2(T)-V_S(T_O)$, $G_1$ and $G_2$ represent respective variable gains.

The above and other objects, features and advantages of the present invention will become apparent from the following description when taken in conjunction with the accompanying drawings.

DESCRIPTION OF THE PREFERRED EMBODIMENTS

Figure 1:
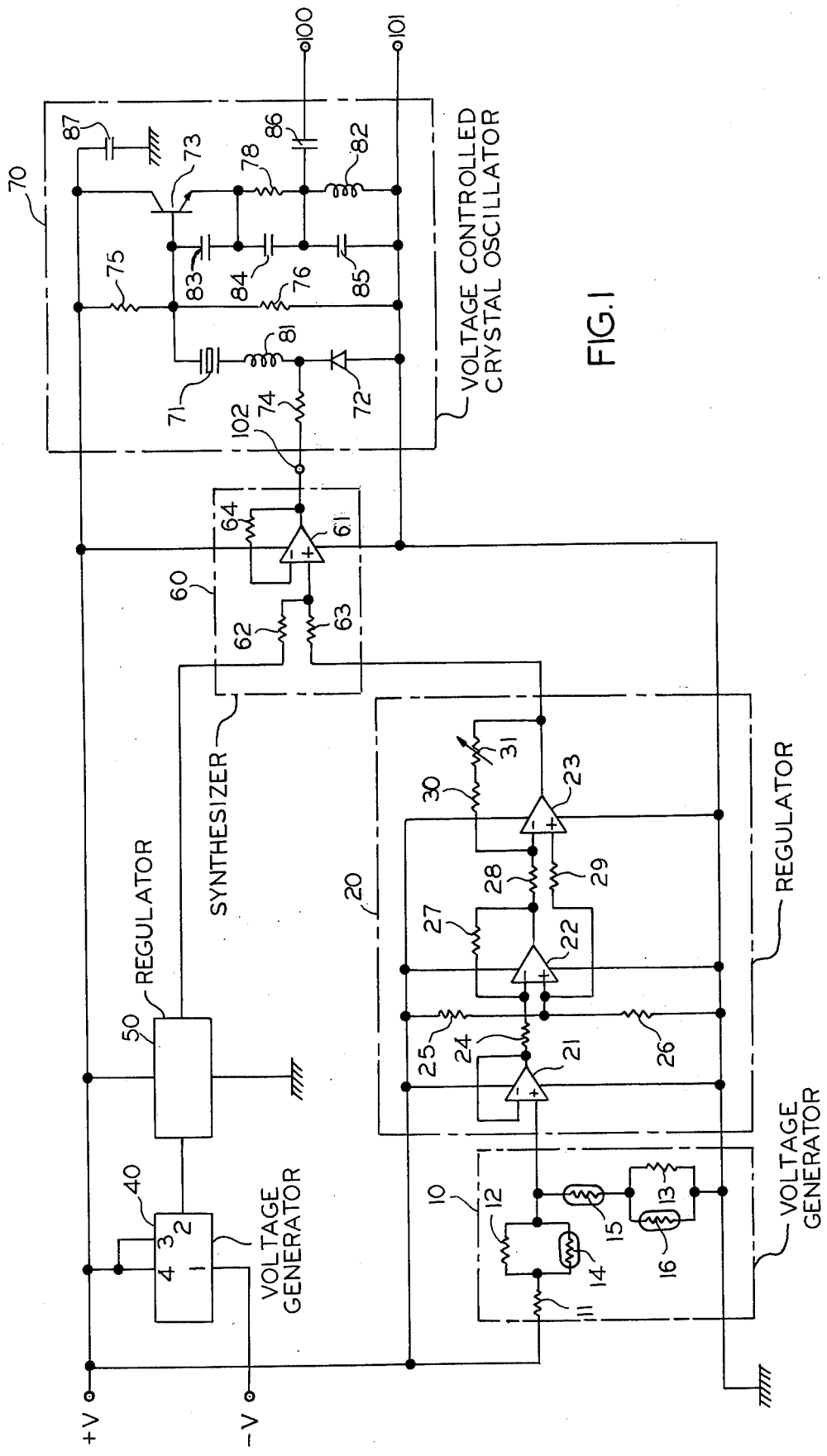
FIG. 1 is a schematic diagram of a preferred form of temperature-compensated crystal oscillator embodying the present invention.

In FIG. 1, reference numerals 10 and 40 indicate voltage generator circuits; 20 and 50, regulating circuits; 60, a synthesizer circuit; and 70, a voltage-controlled crystal oscillator (VCXO). One of the voltage generator circuits 10, includes resistors 11 to 13 and thermistors 14 to 16. The other voltage generator circuit 40 is designed to produce a voltage which is variable with temperature and in proportion thereto. In this example, circuit 40 is the NEC (Nippon Electric Company) model μPC 616C.

The regulating circuit 20 is comprised of a voltage follower circuit 21, a first amplifier circuit including a differential amplifier 22 and resistors 24 to 27, and a second amplifier circuit including a differential amplifier 23, resistors 28 to 30 and a variable resistor 31. The voltage follower 21 is arranged to isolate the voltage generator circuit 10 from the first amplifier circuit. The other regulating circuit 50 is of the same construction as the circuit 20 and serves to control the voltage output of voltage generator circuit 40.

The synthesizer circuit 60 has a differential amplifier 61 and resistors 62 to 64 and serves to add the outputs of the regulating circuits 20 and 50. The VXCO 70 is comprised of a quartz crystal unit or resonator 71, a variable-capacitance diode 72, a transistor 73, resistors 74 to 78, inductors 81 and 82 and capacitors 83 to 86.

Before a description is given of the operation of the circuit shown in FIG. 1, the oscillation frequency slope ($\Delta f/f_o$) vs. temperature characteristic (will be considered. The symbol $f_o$ represents the oscillation frequency at the reference temperature and $\Delta f$ represents the frequency change from $f_o$). The corresponding compensation voltage vs. temperature characteristic of the quartz crystal unit or resonator 71 and voltage-controlled crystal oscillation circuit 70 will also be considered.

Figure 2:
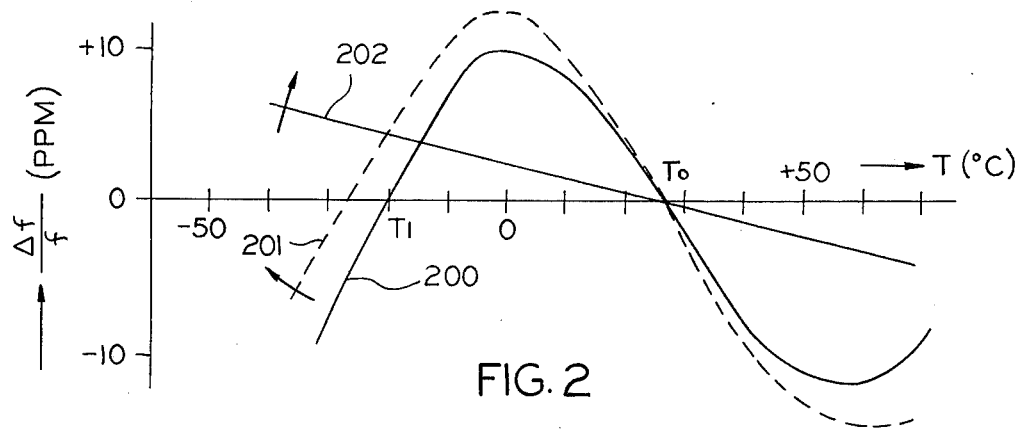
FIG. 2 is a graphic representation of an example of the output oscillation-frequency slope vs. temperature characteristic of the circuit shown in FIG. 1.
Figure 3:
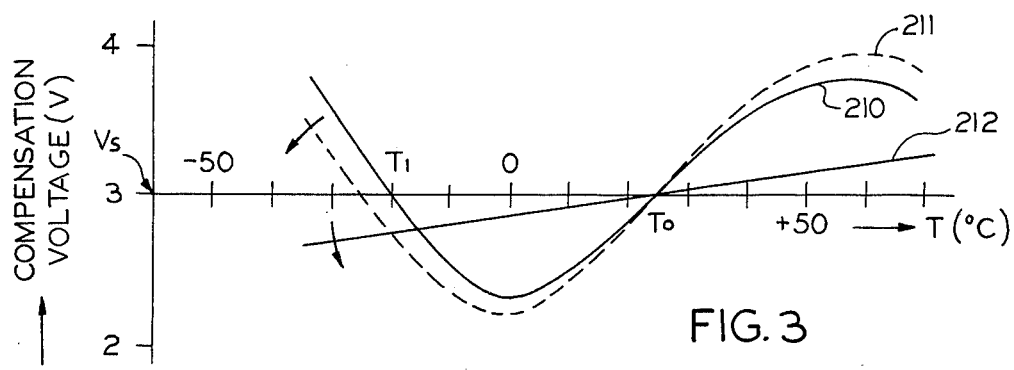
FIG. 3 represents a temperature-compensation-voltage vs. temperature characteristic which corresponds to the characteristic of FIG. 2.

To begin with, the crystal unit generally has a characteristic as illustrated in FIG. 2 by curve 200. Such a crystal unit is inserted in VCXO 70, as at 71. In FIG. 2, curve 201 is obtained by measuring the oscillation frequency slope at different temperatures T, with a fixed voltage $V_s$ applied to the control input terminal 102 of the VCXO 70. It has been found that the difference or vertical distance between the curves 200 and 201 gives a practically straight line 202 which has a negative slope extending through a point ($T_o$, 0), as plotted in FIG. 2. In other words, the curve 201 can be considered to represent the superimposed sum of curve 200 and the straight line 202. The straight line 202 represents the oscillation frequency slope vs. temperature characteristic of the crystal oscillation circuit 70, exclusive of the crystal unit 71. It will be recognized, therefore, that, for compensation of the frequency variation (such as represented by curve 201 of FIG. 2), it will suffice to obtain two separate correction voltages such as indicated in FIG. 3 by the curves 210 and 212, respectively corresponding to curves 200 and 202 in FIG. 2. The voltages represented by curves 210, 212, add to obtain a compensation voltage as shown at 211 in FIG. 3.

Figure 4:
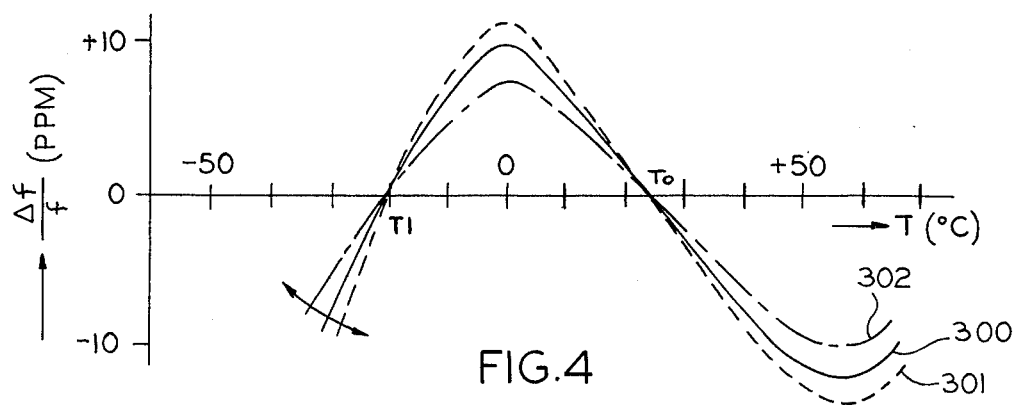
FIG. 4 is a graphical representation of an example of the output oscillation-frequency slope vs. temperature characteristic deriving from variations in capacitance ratio.

Now, it is assumed that a quartz crystal resonator, having the same resonance frequency characteristic, is incorporated in an oscillation circuit which is free from any frequency variation which occurs responsive to change in temperature. This circuit forms the voltage-controlled crystal oscillation circuit 70. In this case, the oscillation frequency slope, as represented by the curves 300, 301 or 302 of FIG. 4, is variable with a change in the capacitance ratio ($\gamma$) of the quartz crystal unit or in the capacitance value of the varactor at the reference voltage. Specifically, the curve 300, taken as a reference, is transformed as into curve 302 with a decrease of the capacitance ratio and is transformed inversely into curve 301 with an increase of the capacitance ratio. The resulting compensation voltage is, therefore, represented by a curve 310, 311 or 312 in FIG. 5, which corresponds to the curve 300, 301 or 302, respectively. In other words, variations in the frequency slope can be compensated by providing a voltage generator circuit adapted to produce a standard compensation voltage, such as is represented by curve 300, and by varying the value of output voltage of the generator circuit to obtain a compensation voltage as represented by curve 311 or 312.

Further, the effects produced by variations in the angle of the cut of the crystal resonator has a tendency which is similar to that shown in FIG. 2, as long as the angle of the crystal cut is properly controlled. It follows, therefore, that the variation in the angle of the crystal cut can be compensated for by adding to the curve 210 a linear function of a voltage having a different slope (212, FIG. 3), as described hereinbefore.

Figure 5:
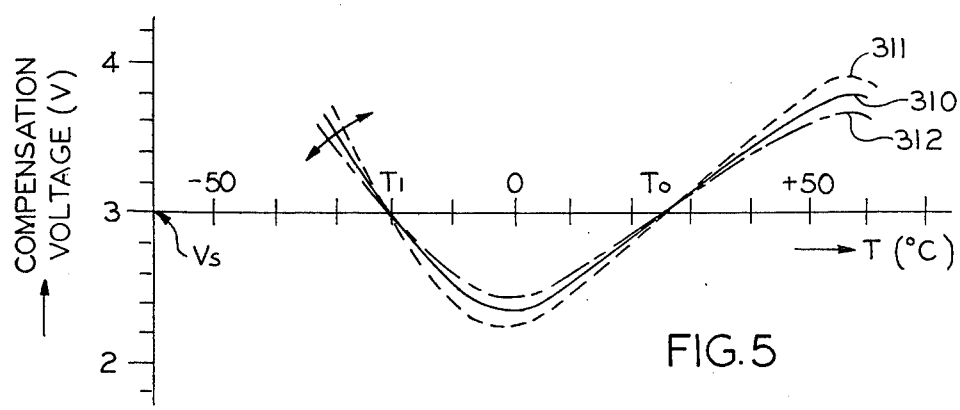
FIG. 5 illustrates an example of the temperature-compensation-voltage vs. temperature characteristic which corresponds to the characteristic of FIG. 4.

It will be recognized, therefore, that the frequency slope can be kept within definite limits by employing a circuit arrangement designed to make variable the standard compensation voltage 210 in FIG. 3 or 310 in FIG. 5. Such a variable voltage may be combined with a linear-varying voltage of variable slope. This eliminates the need for designing temperature-compensation-voltage generator circuits for the respective crystal oscillation circuits.

The construction and performance of such a circuit arrangement will next be described in detail with reference to FIG. 1.

First, in the voltage generator circuit 10, a compensation voltage is produced for compensating the oscillation frequency change deriving from the quartz crystal resonator itself. For example, a voltage is produced which corresponds to a compensation voltage (310, FIG. 5) and is effective to compensate the average frequency slope vs. temperature characteristic (e.g., 300 in FIG. 4) at the average capacitance ratio of a plurality of quartz crystal units, and also to compensate for the mean capacitance of a varactor diode. For the specific design example of the voltage generator circuit 10, reference can be had to the above-cited paper (4). For the range of operating temperature 5° C. to 70° C., a voltage generator circuit may be constructed as shown in FIG. 9 in the reference paper (1). On the other hand, the voltage generator circuit 40 (for example, of the NEC model μpC 616C) produces a voltage proportional to temperature, say, a voltage having a variation of 10 mV/°C.

The output voltages $V_1(T)$ and $V_2(T)$ of the respective voltage generator circuits 40 and 10 are expressed as follows:

$$V_1(T) = V_S + \Delta V_1(T)$$
$$= V_S + x(T - T_o) \quad (1)$$
$$V_2(T) = V_S + \Delta V_2(T) \quad (2)$$

where $V_S$ represents the reference compensation voltage at a reference temperature $T_o$, where $\Delta V_1(T)$ and $\Delta V_2(T)$ respectively represents the voltage differentials between $V_1(T)$ and $V_S$ and between $V_2(T)$ and $V_S$, at temperature T, and where x represents the voltage change for unit temperature change.

The regulating circuit 20 is arranged to convert the output voltage $V_2(T)$ of voltage generator circuit 10 to the following voltage:

$$V_2'(T) = V_S + g_2 \Delta V_2(T) \tag{3}$$

where $g_2$ represents a variable gain, which is expressed as $$g_2 = \frac{R_{24}}{R_{27}} \times \frac{R_{28}}{R_{30} + R_{31}} \tag{4}$$

where $R_{24}$, $R_{27}$, $R_{28}$, $R_{30}$ and $R_{31}$ respectively represent the resistance values of the resistors 24, 27, 28, 30 and 31. It will thus be noted that voltages corresponding to 311 and 312 in FIG. 5 can be obtained by varying $g_2$. Incidentally, resistors 25 and 26 together form a bias circuit for producing the reference voltage $V_S$.

The other regulating circuit 50 is similar to the regulating circuit 20, and converts the output voltage $V_1(T)$ of voltage generator circuit 40 into a voltage that is expressed as $$V_1'(T) = V_S + g_1 \Delta V_1(T) \tag{5}$$

where $g_1$ represents a variable gain which is expressed by the same formula (4). As will be readily noted, effective compensation is obtained by varying $g_1$ or, in this example, $R_{31}$. The compensation is for variations in the oscillation frequency of the oscillation circuit 70, exclusive of the crystal unit. These variations 202 in FIG. 2. The variations of the same circuit 70, which are derived from variations in angle of the crystal cut can also be effectively compensated.

The outputs $V_1'(T)$ and $V_2'(T)$ of the respective regulating circuits 20 and 50 are synthesized at the synthesizer circuit 60 into $V_3(T)$, which is expressed as $$\begin{aligned} V_3(T) &= g_3 V_1'(T) + g_4 V_2'(T) \\ &= g_3 \{V_S + g_1 \Delta V_1(T)\} + g_4 \{V_S + g_2 \Delta V_2(T)\} \end{aligned} \tag{6}$$

where $g_3$ and $g_4$ represent respective gains which are expressed as $$g_3 = R_{62}/R_{64} \quad g_4 = R_{63}/R_{64} \tag{7}$$

where $R_{62}$, $R_{63}$ and $R_{64}$ represent the resistance values of respective resistors 62, 63 and 64.

Supposing $g_3 = g_4 = \frac{1}{2}$, $g_1 g_3 = G_1$ and $g_2 g_4 = G_2$, formula (6) takes the following form:

$$V_3(T) = V_S + G_1 \Delta V_1(T) + G_2 \Delta V_2(T) \tag{8}$$

which represents a compensation voltage such as indicated at 211 in FIG. 3. The combined voltage of formula (8) is fed to the control input terminal 102 of voltage-controlled crystal oscillation circuit 70. It has been found that, with such a compensation voltage, the oscillation frequency slope can be readily held in a range of approximately ±3 ppm.

Incidentally, in the oscillation circuit 70, resistors 75 and 76 are bias resistors and resistor 78 serves to determine the operating current of transistor 73. Capacitors 84 and 87 are bypass capacitors, and capacitors 83 and 85, together with quartz crystal unit 71, coils 81 and 82, varactor 72 (e.g. NEC model 1S 2208 or 1S 2209) and transistor 73, form a Colpitts tertiary overtone type voltage-controlled oscillation circuit. Resistor 74 is a high resistance unit for high frequency suppression.

Capacitor 86 is provided to supply an R.F. voltage only to the output terminals 100 and 101 of the TCXO 70. The oscillation circuit may also be formed like the circuit shown in FIG. 7 in the paper (1).

To summarize, the present invention provides a novel form of temperature-compensated crystal oscillator which can be designed and adjusted with particular ease and simplicity to maintain the frequency variation within certain desired limits. The oscillator includes a pair of independent voltage generator circuits (10, 40), regulating circuits (20, 50) and a synthesizer circuit 60. The circuit arrangement is such that the generator output voltages are properly regulated by the respective regulating circuits and then synthesized by the synthesizer.

What is claimed is:

1. A temperature-compensated crystal oscillator including a voltage-controlled crystal oscillation circuit means comprising a quartz crystal means and a variable-capacitance diode means operated responsive to a control voltage for varying the oscillation frequency thereof, and a control-voltage generator circuit means for producing the control voltage to maintain the oscillation frequency variations with temperature within definite predetermined limits, said control-voltage generator circuit means comprising first means for generating a first voltage $V_1(T)$ which is variable in proportion to changes in temperature T, said first voltage being represented by $V_S(T_O) + \Delta V_1(T)$, where $V_S(T_O)$ represents a reference voltage at a reference temperature $T_O$ and $\Delta V_1(T) = V_1(T) - V_S(T_O)$; second means including at least one thermistor and a plurality of resistors for generating a second voltage $V_2(T)$ which varies in a curvilinear form responsive to changes in temperature T, said second voltage being represented by $V_S(T_O) + \Delta V_2(T)$, where $\Delta V_2(T) = V_2(T) - V_S(T_O)$; and third means for synthesizing said first and second voltages to produce said control voltage which is represented by: $V_S(T_O) + G_1 \Delta V_1(T) + G_2 \Delta V_2(T)$, where $G_1$ and $G_2$ represent respective variable gains.

2. A voltage controlled and temperature compensated crystal oscillator comprising means for generating a first voltage having a characteristic which varies in proportion to temperature caused variations in the output of said oscillator, means for generating a second voltage which has a slope corresponding to the temperature-frequency slope of a crystal type which is used in said oscillator, means coupled to said first voltage generating means for converting said first voltage into a third voltage having a variable gain, means coupled to said second voltage generating means for converting said second voltage into a fourth voltage having a variable gain, means for adding said third and fourth voltages to derive a control voltage, and means for applying said derived control voltage to control said oscillator in a manner which compensates for variations in said characteristic responsive to temperature changes.

3. The oscillator of claim 2 wherein the crystal is a quartz crystal, and the second generating means has a slope which varies as a function of changes in the capacitance ratio of the quartz crystal.

4. The oscillator of claim 2 and a variable-capacitance diode means in a circuit with said crystal, and the second generating means has a slope which varies as a function of changes in the capacitance of said diode means.

5. The oscillator of claim 2 and voltage generating means for producing a standard compensating voltage having said slope characteristic.

6. The oscillator of claim 2 wherein said crystal is cut from a larger crystal, with said cut being at a predetermined angle with respect to the axis of said crystal, and the second generating means has a slope which varies as a function of said angle.

7. A crystal controlled and temperature compensated oscillator wherein said crystal has a temperature vs. frequency characteristic which may be represented by the slope of a line, said oscillator comprising first voltage generating means for producing a voltage which compensates for oscillation frequency changes derived from said crystal, said compensating voltage varying according to said slope of a line, first regulating means coupled to said first voltage generating means for converting the output of said first voltage generating means to have the particular slope characteristic corresponding to the average slope characteristic for the particular type of crystal that is used, second voltage generating means for producing a voltage which is variable with temperature, second regulating means coupled to said second voltage generating means for correcting a voltage having a variable gain which compensates for oscillation frequency variations that occur in said oscillator independently of said average variations for said crystal type, synthesizer means for adding the output of said two regulating means, and means responsive to the output of said synthesizer means for driving said oscillator means to provide an oscillation output which has said temperature compensations.

8. The oscillator of claim 7 and means for adjusting the output of said first and second regulating means.

9. The oscillator of claim 8 wherein said oscillator has a configuration corresponding to a Colpitts tertiary overtone type voltage-controlled oscillation circuit.

* * * * *

UNITED STATES PATENT AND TRADEMARK OFFICE
CERTIFICATE OF CORRECTION

PATENT NO. : 4,302,731
DATED : NOVEMBER 24, 1981
INVENTOR(S) : Shigeaki Ashida

It is certified that error appears in the above—identified patent and that said Letters Patent is hereby corrected as shown below:

Col. 1, Line 53, "31" should be -- - --;

Col. 3, Line 25, after "characteristic" delete "(";

Col. 3, Line 29, after "$f_o$" delete ")";

Col. 4, Line 65, "represents" should be --represent--;

Col. 5, Line 30, after "variations" insert --correspond to line--;

Col. 5, Line 64, "uanit" should be --unit--.

Signed and Sealed this

Ninth Day of March 1982

[SEAL]

Attest:

GERALD J. MOSSINGHOFF

Attesting Officer     Commissioner of Patents and Trademarks